United States Patent [19]

Brody

[11] 4,160,927
[45] Jul. 10, 1979

[54] FERROELECTRIC CERAMIC DEVICES

[75] Inventor: Philip S. Brody, Brookmont, Md.

[73] Assignee: The United States of America as represented by the Secretary of the Army, Washington, D.C.

[21] Appl. No.: 784,761

[22] Filed: Apr. 5, 1977

Related U.S. Application Data

[60] Division of Ser. No. 533,365, Dec. 16, 1974, Pat. No. 4,051,465, which is a continuation-in-part of Ser. No. 411,853, Nov. 1, 1973, Pat. No. 3,855,004.

[51] Int. Cl.$^2$ ............................................. G21D 7/00
[52] U.S. Cl. ................................... 310/302; 310/304; 136/89 TF; 429/5
[58] Field of Search ......... 310/302, 304, 358, DIG. 5; 136/89 TF, 202, 89 ST, 89 RP; 73/359; 252/62.9; 365/109, 117, 145; 429/5

[56] References Cited

U.S. PATENT DOCUMENTS

| | | | |
|---|---|---|---|
| 2,663,802 | 12/1953 | Ohmart | 310/302 |
| 2,691,738 | 10/1954 | Matthias | 350/150 |
| 2,876,368 | 3/1959 | Thomas | 310/305 |
| 2,926,336 | 2/1960 | Chynoweth | 365/145 |
| 3,226,225 | 12/1965 | Weiss et al. | 136/89 NB |
| 3,702,724 | 11/1972 | Land et al. | 365/109 |
| 3,855,004 | 12/1974 | Brody | 136/89 TF |

OTHER PUBLICATIONS

Chynoweth, "Surface Space Charge Layers in Barium Titrate," 5/1/56, pp. 705-714, Physical Review, vol. 102, #3.

Cox et al., "The Optical Absorption Edge of Barium Titarate," 1966, pp. 743-745, But. J. Appl. Phys., vol. 17.

Irie, "Photovoltaic Effect in Ferroelectic and Photoconductive SbSI, 1971, J. Phys. Soc, Japan, p. 1506, vol. 30.

*Primary Examiner*—Nelson Moskowitz
*Attorney, Agent, or Firm*—Nathan Edelberg; Robert P. Gibson; Saul Elbaum

[57] ABSTRACT

An electrical battery comprised of a substrate of a radioactively ionized, electrically polarized, polycrystalline ferroelectric ceramic material, which is disposed between a pair of conductive electrodes. The radioactive ionization produces non-equilibrium carriers in the substrate, resulting in the development of an emf across the electrodes.

2 Claims, 25 Drawing Figures

FERROELECTRIC CERAMIC DEVICES

RIGHTS OF THE GOVERNMENT

The invention described herein may be manufactured, used and licensed by or for the United States Government for governmental purposes without the payment to the inventor of any royalties thereon.

RELATED CASES

This is a division of application Ser. No. 533,365 filed Dec. 16, 1974, now U.S. Pat. No. 4,051,465, which is a continuation in part of prior application Ser. No. 411,853, filed Nov. 1, 1973. The disclosure in such prior application is incorporated by reference thereto herein.

BACKGROUND OF THE INVENTION

This invention generally relates to solid state devices exhibiting photovoltaic effects and is particularly directed to the provision of a device consisting of a class of polycrystalline ferroelectric ceramic materials which have been discovered to produce voltages upon the application of incident light thereto, such voltages having values many orders of magnitude higher than voltages typically produced by conventional photovoltaic materials.

Initially, and as background, the instant inventive apparatus and techniques to be discussed hereinbelow are to be clearly distinguished from the photovoltaic effect now known in the prior-art in that the mechanism for the effect to be discussed herein appears to be unique and different from photovoltaic mechanisms previously described.

SUMMARY OF THE INVENTION

It is the primary objective of the instant invention to provide a device and technique by which extremely high voltage can be generated utilizing a solid state polycrystalline class of materials upon the application to such materials of incident light, the voltage generated exhibiting properties entirely unlike the well-known photovoltaic effect of the prior art and of orders of magnitude higher than voltages previously obtainable.

The present application is directed to a device wherein the polycrystalline material, which is a ferroelectric ceramic, is radioactively ionized. This causes non-equilibrium carriers to be formed, and the device acts as a self-contained battery, even when not exposed to light.

BRIEF DESCRIPTION OF THE DRAWINGS

The invention itself will be better understood and further features and advantages thereof will become apparent from the following detailed description thereof, such description making reference to the appended sheets of drawings, wherein.

DETAILED DESCRIPTION OF THE INENTION

Figure 1:
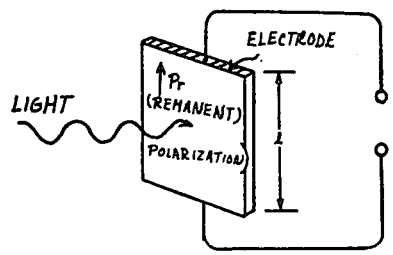
FIG. 1 is a schematic diagram illustrating the basic arrangement by which photovoltaic voltages are generated upon the application of incident light to a ferroelectric ceramic material in accordance with the teachings of the instant invention.

While the present invention is directed to a battery utilizing a radioactively ionized ferroelectric ceramic substrate, the behavior and theory of this device is closely related to the device which is illustrated in FIG. 1, which uses a ferroelectric ceramic which is not radioactively ionized, but which produces a voltage upon being irradiated with light. Since more research has been done and more data has been accumulated with respect to the visible light device it will be discussed in some detail before disclosure of the device of the present invention.

With reference now initially to FIG. 1 of the application drawings, a discussion of the novel phenomena of the devices will ensue. Upon the application of incident illumination to the ferroelectric ceramic, a steady voltage is produced which is proportional to the length l between the electrodes. By dividing the sample into two equal segments along a line perpendicular to the direction of the remanent polarization and by placing new electrodes on the cut edges, new samples would result each producing photo-emf's which is one half the original photo-emf.

Figure 2:
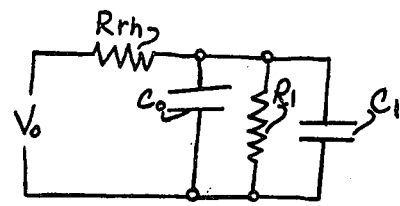
FIG. 2 is an electrical schematic diagram depicting an equivalent circuit to the basic apparatus of FIG. 1, wherein $C_0$ is the capacitance of the sample measured utilizing a capacitance meter connected between the electrodes and $C_1$ is the parallel capacitance of a load coupled to the electrodes, and $R_1$ is the resistive value of such load.
Figure 3:
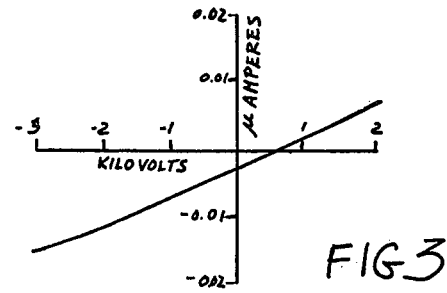
FIG. 3 is a graphical illustration of current vs. applied voltage to an illuminated ferroelectric wafer of the basic form depicted in FIG. 1.
Figure 4:
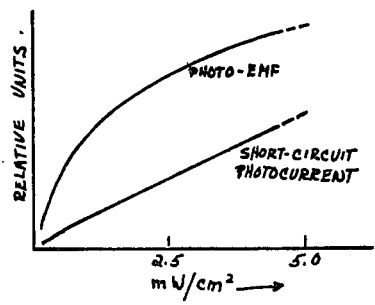
FIG. 4 is a graphical illustration of the photo-emf and photocurrent as a function of intensity of illumination, with the particular graphical results being for a solid solution Pb $(Zr_{0.53}Ti_{0.47})O_3$ with about 1% $Nb_2O_5$ by weight added.

An arrangement such as that shown in FIG. 1 can be described roughly by the equivalent circuit as shown in FIG. 2. This has a saturation photo-emf $V_o$, in series with the photo resistance of the illuminated sample. FIG. 3 is a current-voltage characteristic of a typical illuminated ferroelectric slab, and has the form expected from the equivalent circuit in FIG. 2 except that the slight tendency towards saturation in the lower left quadrant. As a function of intensity, the photo-emf saturates at relatively low levels of illumination. The short circuit photocurrent is, however, linear with light intensity. Results for the material $Pb(Zr_{0.53}, Ti_{0.47})O_3$ with 1 wt% $Nb_2O_5$ are shown in FIG. 4. The implication of these results and the equivalent circuit in FIG. 2 is that the photoresistance $R_{ph}$ is inversely proportional to intensity.

A saturation photo-emf and a short circuit current proportional to intensity has been measured in several poled ferroelectric materials. These are shown in Table I.

Table I:

Photovoltaic outputs at room temperature for several ceramic compositions. The wafers were fully poled, to their maximum remanent polarization. Filtered illumination had a held bandwidth of about 10 nm. The photo-emf is a saturation value reached at relatively low value of intensity.

| Sample | Illumination Wavelength (nm) | Saturation Photo-emf (Volts/cm) | Short Circuit Photocurrent ($\frac{\mu Amperes/cm}{watts/cm^2}$) |
|---|---|---|---|
| $Pb(Zr_{.53}Ti_{.47})O_3$ + 1 wt% $Nb_2O_5$ | 373 | 610 | .31 |
| $BaTiO_3$ + 5 wt% $CaTiO_3$ | 403 | 360 | .020 |
| $Pb(Zr_{.65}Ti_{.35})O_3$ with 7% lanthanum-lead substitution | 382 | 1500 | .030 |
| $Pb(Zr_{.65}Ti_{.35})O_3$ with 8% lanthanum-lead substitution | 382 | 750 | .015 |
| $BaTiO_3 + 5wt\% CaTiO_3$ | 403 | 355 | .02 |
| $Pb(Zr_{.53}Ti_{.47})O_3 + 1wt\% Nb_2O_5$ with polished surfaces | 382 | 610 | ~.61 |

For a given composition the photo-emf is also a function of grain size. These results are shown in Table II.

Table II

Photo-emf for different grain size and percent lanthanum substituted for lead. The materials are $Pb(Zr_{.65}Ti_{.35})O_3$ with 7% lanthanum substitution for lead and the same material with an 8% lanthanum substitution for lead.

| Grain Size (microns) | Percent Lanthanum-Lead Substitution (percent) | Saturation Photo-emf (Volts/cm) |
|---|---|---|
| 2–4 | 7 | 1500 |
| 4–6 | 7 | 980 |
| greater than 6 | 7 | 560 |
| 2–4 | 8 | 750 |
| 3–5 | 8 | 510 |
| 4–6 | 8 | 330 |
| greater than 6 | 8 | 250 |

Figure 5:
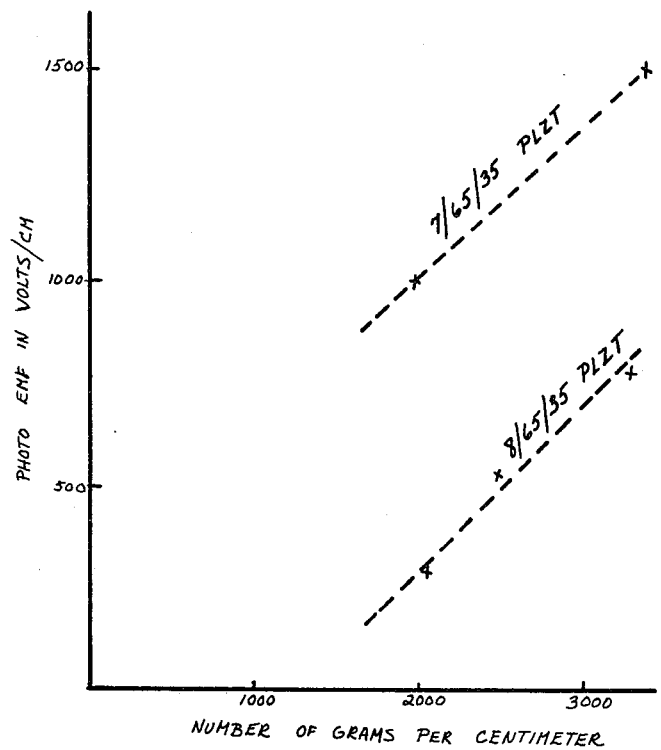
FIG. 5 is a graphical illustration of photo-emf vs. grains per unit length (inverse median grain size) for two different materials.

The photovoltage v. number of grains per unit length is plotted in FIG. 5 for two different compositions. The plot clearly shows a relationship between the two quantities.

Figure 6:
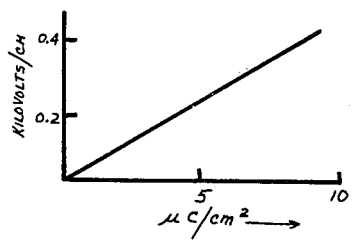
FIG. 6 is a graphical illustration of photovoltage vs. remanent polarization for ceramic Ba Ti $O_3$+5wt% $CaTiO_3$.

The fact that the photo-emf of a particular sample depends on the remanent polarization is shown by the results for a typical ferroelectric material, barium titanate+5wt% $CaTiO_3$, as plotted in FIG. 6.

The short circuit photocurrent depends strongly on the wave length of the impinging illumination. It is a maximum at a wave length resulting in a photon energy equal to the band gap energy of the material. Other wave lengths can, however, contribute strongly to the current.

Figure 7:
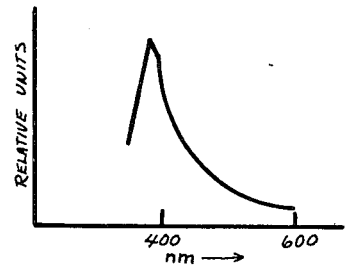
FIG. 7 is a diagram illustrating the short circuit photocurrent as a function of wave length for the solid solution Pb $(Zr_{0.53}Ti_{0.47})O_3$.
Figure 8:
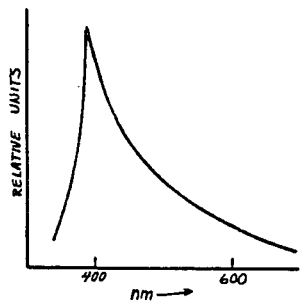
FIG. 8 is a diagram illustrating the short circuit photocurrent as a function of wave length for ceramic $BaTiO_3$+5wt% $CaTiO_3$.
Figure 9:
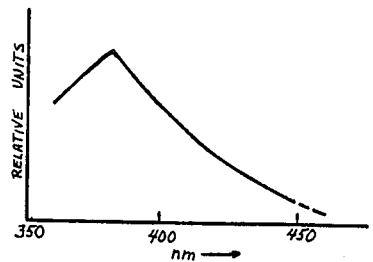
FIG. 9 is a diagram illustrating the short circuit photocurrent as a function of wave length for the solid solution Pb $(Zr_{0.65}Ti_{0.35})O_3$ with 7% of the lead substituted for by lanthanum.

Results for typical materials are shown in FIGS. 7, 8, and 9. The current (ordinate) is that produced by illumination contained in a small band, of about ±10 nm about a wave length indicated on the abscissa. A mercury source and notch type dichroic filters were used. The total intensity within each band was only roughly constant. The current that has been plotted has been therefore normalized to constant intensity by assuming the linear relation between the two.

Figure 10:
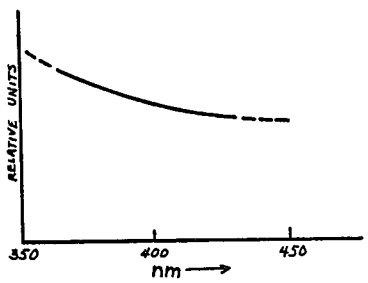
FIG. 10 is a diagram illustrating the photo-emf vs. wave length for the solid solution Pb $(Zr_{0.53}Ti_{0.47})O_3$ with 1% by weight of $Nb_2O_5$ added.

The photo-emf is less strongly dependent on wave length. Results for a particular material, using notch dichroic filters is shown in FIG. 10. These values are saturation values, roughly independent of intensity.

Figure 11:
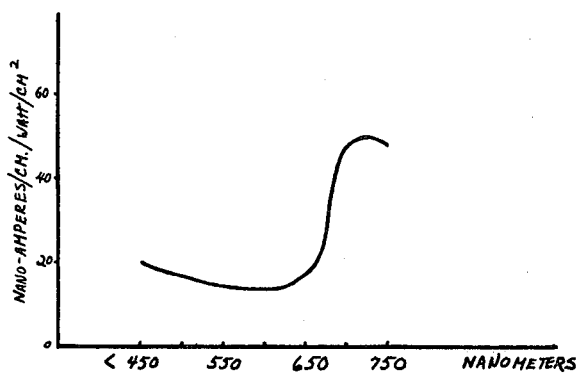
FIG. 11 is a diagram illustrating the photocurrent divided by intensity vs. cut-off wave length of long wave length cut-off dichroic filters, with the materials being Pb $(Zr_{0.53}Ti_{0.47})O_3$ with 1% by weight of $Nb_2O_5$ added and utilizing a high pressure mercury arc as the illumination source.
Figure 12:
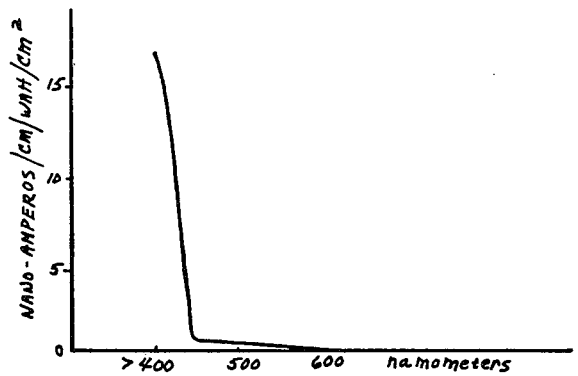
FIG. 12 is a diagram illustrating the photocurrent divided by intensity vs. cut-off wave length of short wave length cut-off filters, with the material being Pb $(Zr_{0.53}Ti_{0.47})O_3$ with 1% by weight of $Nb_2O_5$ added.

An important additional phenomena shows a dependence of current produced in the red and infrared regions in the presence of simultaneous blue band gap radiation. These results are shown in FIGS. 11 and 12. The ordinate (FIG. 11) is the current produced by the light from a mercury arc shining through dichroic long wave length cut off filters, the abscissa the wave lengths above which no light illuminates the sample. Note the step at 650 nm. Using short wave length cut off filters which eliminate the band gap light results in no current until the cut off wave length is below the band gap. These results are shown in FIG. 12. The amount of output in the red actually depends on the intensity of simultaneous band gap radiation, thus the energy efficiency of these materials for a broad band source is not simply the intensity weighted average of the efficiencies for individual wave lengths as produced by notch filter. The actual value is larger.

Figure 13:
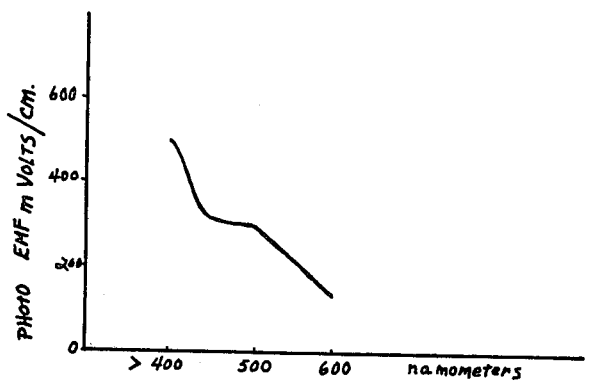
FIG. 13, is diagram illustrating the photo-emf vs. wave length of short wave length cut-off filters, with the material being Pb $(Zr_{0.53}Ti_{0.47})O_3$ with 1% by weight of $Nb_2O_5$ added.

Photo-emf vs. cut-off wave length for $Pb(Zr_{0.53}, Ti_{0.47})O_3 + 1wt\% Nb_2O_3$ is shown in FIG. 13. A substantial photo-emf appears at long wave lengths but no current can flow. In other words the internal resistance $R_{ph}$ is extremely high unless band gap is incident.

Single Crystal Results

Figure 14:
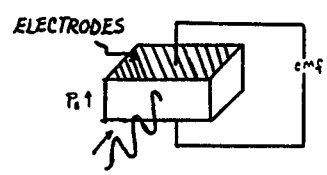
FIG. 14 is a pictorial illustration of the manner in which a single crystal produces a photo-emf, with the polarization $P_s$ being normal to the electrodes, which electrodes are illustrated by the shaded area.

The ceramic results imply a small photo-emf from a single crystal illuminated as shown in FIG. 14. Such emf=0.55 V at room temperature was indeed observed.

Figure 15:
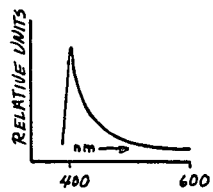
FIG. 15 is a diagram illustrating photocurrent vs. wave length of the single crystal $BaTiO_3$.

The short circuit current is, as for the ceramic material, a strong function of wave length. These results are shown in FIG. 15.

Temperature Dependence

Figure 16:
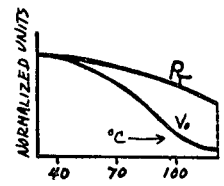
FIG. 16 is a diagram illustrating the photovoltage vs. temperature for $BaTiO_3$+5wt% $CaTiO_3$.
Figure 17:
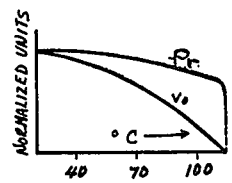
FIG. 17 is a diagram illustrating the photovoltage vs. temperature of single crystal $BaTiO_3$.
Figure 18:
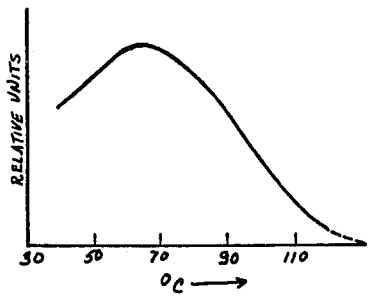
FIG. 18 is a diagram illustrating photocurrent vs. temperature for $BaTiO_3$+5wt% $CaTiO_3$.

Ceramic photo-emf is a function of temperature. Results for barium titanate ceramic with 5 wt% $CaTiO_3$ are shown in FIG. 16. For both $Pb(Zr_{0.53}, Ti_{0.47})O_3$ with 1 wt% $Nb_2O_5$ added and barium titanate the photo-emf decreases with increasing temperature. In these measurements, the temperature ranged to the transition temperature, and photo-emf vanishing at the temperature at which the remanent polarization also vanishes. The remanent polarization vs. temperature for this material is also shown in FIG. 16. Similar results for single crystal barium titanate are shown in FIG. 17. The single crystal photo-emf are, of course, much smaller. Short circuit was measured as a function of temperature. Results for barium titanate +5wt% $CaTiO_3$ are shown in FIG. 18. Similar results over the same temperature range were obtained for $Pb(Zr_{0.53}, Ti_{0.47})O_3 + 1$ wt% $Nb_2O_5$ material. In that case there was no maximum, the photocurrent still increasing with increasing temperature at 130° C.

Effects of Optical Properties

In the arrangement shown in FIG. 1, the direction of polarization, and consequently the direction of the photo-emf is perpendicular to the direction of incidence of the light which is also the direction in which the light is strongly absorbed. The light only enters into a region near the surface of the material. The rapidity of the absorption depends strongly on the wave length of the light, the light becoming fully absorbed in a region closer and closer to the surface as one decreases the wave length of the light and approaches the band gap wave length. For shorter wave lengths, the light no longer enters the material and thus for these wave lengths the light induced effects decrease rapidly with decreasing wave length.

Figure 19:
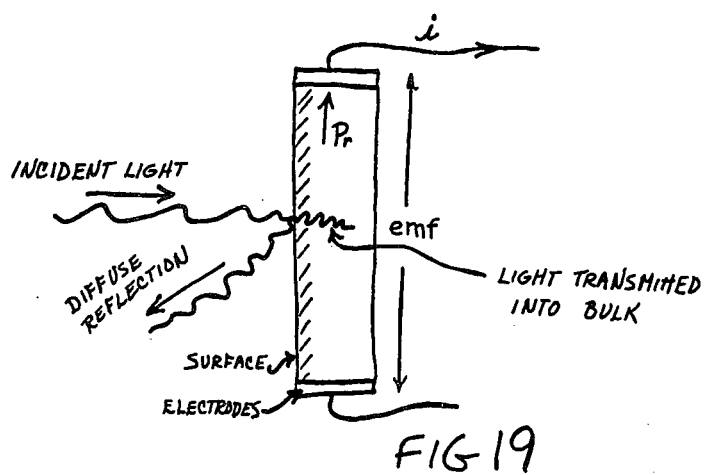
FIG. 19 is a cross-sectional, elevational view schematically depicting the ceramic slab of FIG. 1, with the photo-emf appearing across the electrodes on the edge, and with most of the photocurrent flow being found in the shaded region near the surface.

Ceramic materials which exhibit these photo-emf's can appear transparent, translucent, and apparently opaque when viewed with white light. Light, however, obviously enters even the opaque materials to produce the photo-emf's. The apparent opacity is produced by diffuse reflection at granular boundaries. It is of course desirable to minimize the degree to which diffuse relectivity prevents light from entering the material. Nevertheless, the largest photocurrents and greatest photovoltaic efficiency has been originally observed in a material which appears opaque in thickness more than a few thousandths of an inch. The cross sectional drawing FIG. 19 depicts the way light enters the material with the arrangement as originally shown in FIG. 1.

When a circuit connects the electrodes, the maximum density of current occurs near the surface, the current density decreasing in regions deeper within the thickness.

Figure 20:
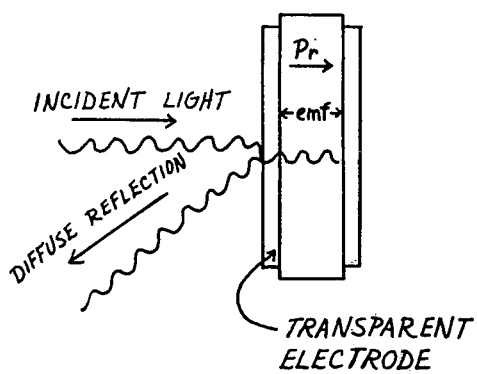
FIG. 20 is a cross-sectional, elevational view of a slab of ferroelectric ceramic material utilizing transparent electrodes and depicting light incident through the transparent electrodes into the slab with the slab being polarized in the thickness direction.

Polishing the surfaces of these materials, however, increases the transparency and, as expected, the magnitude of the photocurrent and the photovoltaic conversion efficiency. An emf will also be produced by the arrangement shown in FIG. 20 provided, of course, that the electrodes are of a nature to allow light to enter the material. Normal thick metal electrodes are opaque to light. When metal electrodes are thin enough, they permit light to be transmitted and yet are sufficiently conductive to function as electrodes. Other conducting transparent electrodes include indium oxide. The emf now will be seen to appear across the thickness of the material, in the direction of the remanent polarization.

In this arrangement the high dark resistance of any unilluminated bulk portion of the material is in series with the circuit connecting the electrodes. The current that can be drawn is limited. Maximum currents can be drawn when the thickness between the electrodes is equal to or less than the absorption depth of the radiation. Since, however, the saturation photo-emf is not a strong function of intensity, vanishing only for extremely low intensities, the full photo-emf per unit length $v_o$ can usually be observed for thin samples.

Proposed Mechanism for the High Voltage Photovoltaic Effect in Ferroelectrics Briefly, it is proposed that the photo-emf results from the action of an internal field within the bluk of an individual ceramic grain on non-equilibrium carriers generated by illumination. These carriers move to screen the internal field. The photo-emf that appears is the open circuit result of such screening. A change in charge distribution upon illumination changes the voltage across a grain from an initial value of zero to the photovoltages which are observed.

Figure 21:
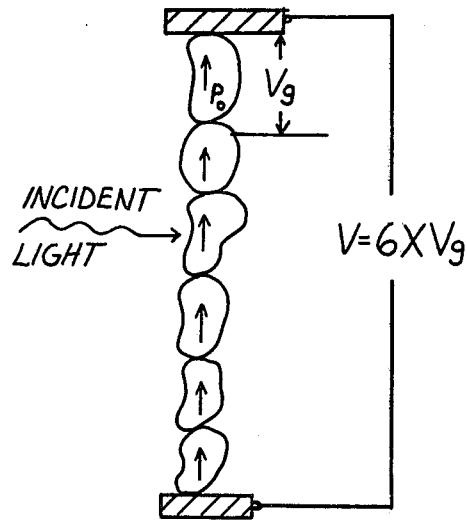
FIG. 21 is a cross-sectional diagramatic illustration of a single layer of grains depicting the manner in which photo-emf's are produced across the grains in an additive fashion to produce a length dependent effect in the ceramic material, the illumination being incident from the left-hand portion of the drawing and being typically quickly absorbed as it penetrates the material.

These photo-emf's appear across individual ceramic grains. What is observed as a length dependent high photovoltage is the series sum of the photo-emf's appearing across grains, each of which is characterized by saturation remanent polarization $P_o$. The situation is shown schematically in FIG. 21. Individual grains typically are small, of the order of 10 microns in diameter. To produce a high photovoltage per unit length in the ceramic the voltage across an individual grain need not be large. For example the results in Table II for Pb($Zr_{0.65}$, $Ti_{0.47}$)$O_3$ with 7% La for Pb can be explained by individual grain photovoltage of only about 0.5 volts per grain. The clear implication of the experimental results (Table II and FIG. 5) is that for the range of grain sizes investigated, the photo-emf across a grain is more or less independent of the size of the grain. This is supported also by the singel crystal results.

Ferroelectric crystals are characterized by large spontaneous polarization which would be expected to produce large emf's even in the dark. Such emf's are not observed even across highly insulating materials. This is presumed to be the result of space charge within the volume or on the surface of a ferroelectric crystal (which, in ceramics, are the individual grains or crystallites). The space charge produces a potential across a crystal cancelling the potential produced by the net polarization within they crystal. It is obvious that as long as there are sufficient charges within the crystal which are free to move, any potential produced by an internal polarization will eventually vanish.

This dark zero potential state is the initial state of a crystal crystallite, grain, and of the ceramic body composed of these grains. The absence of a net potential in the dark does not however mean the absence of internal fields. Internal fields can be expected to exist and are the consequence of the spatial distribution of the charges which bring the net potentials across grains to zero. These spatial distributions can not be arbitrarily assigned, but are subjected to constraints of a basic physical nature.

Figure 22:
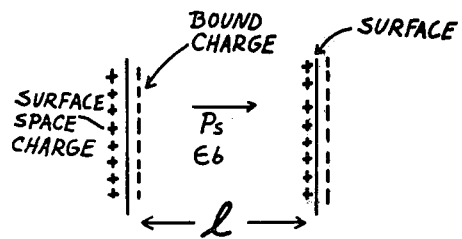
FIG. 22 is a diagram illustrating idealized two dimensional crystals of length l with spontaneous polarization $P_s$, dielectric constant $\epsilon_b$ compensating surface charge per unit area of $\sigma = P_s$.

In the idealized two dimensional crystal shown in FIG. 22, the surface charge density $\sigma = P_s$ reduces the potential between the surfaces to zero. If the surface charge density (in actuality this does not occur) is completely juxtaposed upon the bound polarization surface charge, which has a value $P_s$, then there are no internal fields. Were there no space charge, the crystal would show an internal field $P_s/\epsilon_b$ and a potential between the surfaces of $P_s l/\epsilon_b$.

Such a field would be well above the dielectric breakdown strength of a real dielectric. For a single domain typical ferroelectric barium titanate $P_s = 26 \times 10^{-2} C/m$, and the relative dielectric constant $\epsilon_r$ in the direction of polarization is 137. The field that would have to exist in the absence of compensation charge is over $2 \times 10^6$ volts/cm which is well above the dielectric strengths typical of these materials. If such a field could momentarily exist within a ferroelectric crystal it would not exist for long but be reduced from its maximum value to some value below the dielectric strength of the material. The strong field would break down the material and a charge flow would produce a space charge distribution resulting in a new lower value for the internal fields within the crystal.

Such a space charge distribution must exist in an actual crystal. The space charge serves to reduce the potential across a crystal to zero. Such charges have limited mobility and the materials continue to behave as insulators for ordinary strength applied fields.

Such a space charge cannot occupy a delta function-like region as in the idealized situation shown in FIG. 22, but must occupy instead a finite volume. If these are localized near the surface of the crystal, then an internal field $E_b$ exists within the bulk of the material and additional fields $E_s$ exist within the space charge regions near the surface.

It is hypothesized that these space charge regions are near the surface of real crystals with the charge distributed within a surface layer thickness s. The reasons for same are as follows: (1) The surface regions of ferroelectric crystals are characterized by regions whose dielectric, ferroelectric, and thermodynamic properties differ markedly from that of the bulk. These differences are best explained by the existence of strong fields in this region that would be produced by space charge. There is a considerable body of information in the literature supporting the existance and delineating the properties of these layers; (2) The interplay of space charge and the very non-linear dielectric constant of ferroelectric would be expected to localize space charge in a low dielectric constant layer near the surface. In ferroelectrics, unusually high, low field relative dielectric constants (of the order of 1000) can be expected to reduce in value with increasing field strength. Thus charge in a region reduces the dielectric constant of that region increasing the field strength of that region. This feedback mechanism can be shown to localize charge within a layer.

The experimental results supporting the existance of surface layers will not be reviewed here, nor the calculations which support the localization of charge into layers as a result of a non-linear (saturable) dielectric constant. These may be reviewed by referring to the literature.

Figure 23:
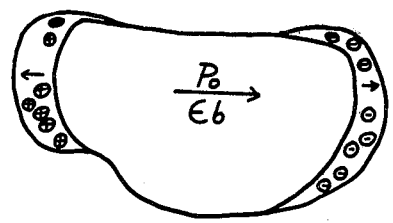
FIG. 23 is an illustration depicting the structure of a typical ferroelectric grain or crystallite.

A schematic description of a typical grain, i.e. crystallite, with space charge regions of thickness s, and a bulk region of thickness l, is shown in FIG. 23. The internal fields (in the two dimensional model) of such a charge distribution superimposed on that produced by the bound polarization charge will be calculated and also the effect of these fields on carriers within the bulk produced as the result of an internal photo effect (photoionization). Formulae for the photo emf that will be derived will have the correct sign, a linear dependence on remanent polarization, and the kind of temperature dependence that has actually been observed. In addition there will result an estimate of a size independent grain photo-emf for a typical ferroelectric, barium titanate, which is consistant with that implied from the observed ceramic emf, and single grain emf. The grain has as shown in FIG. 23: (1) A bulk region with dielectric constant $\epsilon_b$ and uniform polarization (at zero applied field) $P_o$; (2) Surface layers of dielectric constant $\epsilon_s$, considerably less than that of the bulk. There are also polarization in the surface regions $P_s(x)$ which exist at zero applied field. These will generally be parallel to the bulk polarization at one end and anti-parallel at the other end; (3) Space charges in these surface layers which serves to remove any potential across the grain. It is the space charge layers which produce high fields which reduce the highly non-linear dielectric constant or the bulk to the lesser value in the surface layers, and also produce the remanent polarization, $P_s(x)$ with the surfaces.

Such a structure also has an internal bulk field, and surface fields which can be calculated. For the purposes of this calculation we assume a simple two dimensional model shown in FIG. 24.

The polarization with the various regions are assumed only for simplicity to be uniform within these regions. Again, only for simplicity those in the surface layers and the bulk are assumed equal in magnitude (i.e. $P_s(x) = P_o$). The space charge densities $\pm n_o e$ are also assumed uniform and equal in magnitude. The polarizations are equivalent to four bound surface charge densities.

$$\sigma_1 = P_o \quad \sigma_2 = -2P_o \quad \sigma_3 = 0 \quad \sigma_4 = P_o$$

Figure 24:
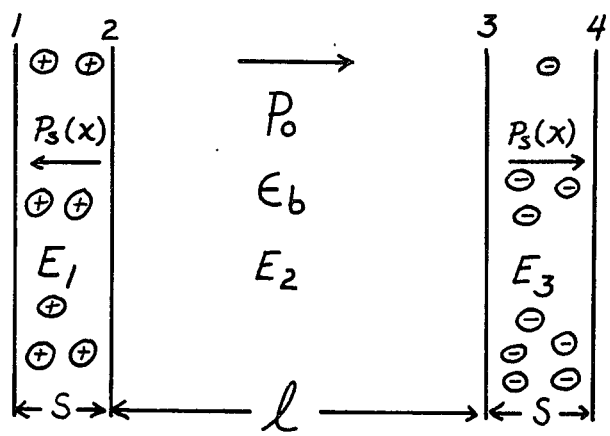
FIG. 24 is an illustration depicting a model of a crystal of length l.

There are, using Gauss's law, electric fields as shown in FIG. 24.

$$E_1 = (1/\epsilon_S)[P_o + M_o EX]$$

$$E_2 = (1/\epsilon_b)[-P_o + M_o es]$$

$$E_3 = (1/\epsilon_S)[-P_o + n_o e(s-x)]$$

It has been assumed that the voltage across the crystal vanishes, $$\int_0^{l+2s} E(\chi)d\chi = 0$$

$n_o$ and s, from this and the three preceeding equations, must be related by the expression $$M_o es = \frac{P_o}{1 + \frac{\epsilon_b}{\epsilon_s} \frac{s}{l}}$$

and the bulk field $$E_2 = -\frac{P_o}{\epsilon_b} \left[ \frac{\frac{s}{l} \frac{\epsilon_b}{\epsilon_s}}{1 + \frac{s}{l} \frac{\epsilon_b}{\epsilon_s}} \right]$$

Surface layers in barium titanate ceramic grains have been estimated at $10^{-6}$ cm (see for example Jona and Shirane, Ferroelectric Crystals, Pergammon Press, 1962). The remanent polarization typical of the ceramic material is about $8 \times 10^{-2}$ C/m², the relative dielectric constant of the poled ceramic about 1300. The high field dielectric constant will be estimated at roughly 0.5 the bulk dielectric constant. These numbers yield a bulk field, for a typical $10^{-3}$ cm grain of, $$E_2 = 350 \text{ volts/cm}$$

The potential across the bulk would thus be approximately $-0.35$ volts. The remaining potential across the grain would be that across the surface layers.

Illumination has the effect of producing charges which screen the internal field, $E_2$, causing it to vanish.

The negative voltage vanishes and a positive potential appears across the sample. The light makes the sample look more positive. This is exactly what happens as the result of a thermally-induced decrease in polarization. Thus the pyroelectric voltage is in the same direction as the photovoltage as is experimentally observed.

In the fully screened case, the photo-emf is also the emf across the two surface layers $$\Delta V = \left[ \frac{P_o}{\epsilon_s} \frac{1}{1 + \frac{\epsilon_b}{\epsilon_s} \frac{s}{l}} \right] S \simeq .35 \text{ volts}$$

The light generated free electrons set up a counter field which tends to cancel the bulk field $E_2$; thus, the observed voltage drop is less than it would be in a perfectly insulating medium. This is what is meant by the term screening. The counter field approaches $-E_2$. Assuming the shielding occurs only in the bulk, the total voltage across the grain is now the sum of the voltages across the surface layers.

The photo-emf is in the opposite direction to the bulk polarization. This fact predicted in the theory is what is always observed experimentally. The complete screening of the bulk field thus would, in barium titanate, be expected to result in a photo-emf of $+0.35$ volts per grain or 350 V/cm and about 0.35 volts across a macroscopic single crystal. These are roughly the values actually observed as seen in Table I, and with the single crystal results. The linear relation between remanent polarization and saturation photo-emf as shown in FIG. 6 is also predicted by these equations. The dependence on temperature of the photo-emf as shown in FIGS. 16 and 17 is predicated by the fact that as one approaches the curie temperature, not only is $P_o$ decreasing but the dielectric $\epsilon_s$ is increasing. The bulk internal field, $E_2$, should therefore decrease with temperature more rapidly than the remanent polarization.

Screening

Solving the general problem of screening in a ferroelectric is difficult. Many of the principles involved can be demonstrated by solving a special case. The special case is meant to be particularly applicable to the Pb($Zr_{0.53}$, $Ti_{0.47}$)$O_3$ +1 wt% $Nb_2O_5$ material.

Utilized, only for simplicity, is a two dimensional model, with photo-produced carriers limited to those of a single sign. It will be assumed that these are electrons generated from deep trapping levels midway in the band gap, and that the illumination empties all the traps leaving fixed positive charges to replace the original traps. The complete emptying of a deep trapping level would produce the long wave length photovoltages and the phenomena of an intensity saturation of the photo-emf typical of the Pb($Zr_{0.53}$, $Ti_{0.47}$)$O_3$+1 wt% $Nb_2O_5$.

Figure 25:
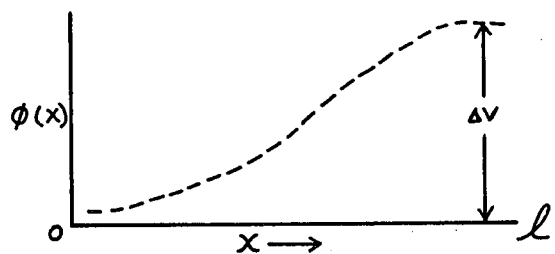
FIG. 25 is a diagram illustrating the potential distribution in an illumenated crystal.

Consider a two dimensional illuminated slab of length l within which is an internal field E and within which light generates a uniform density of electrons $n_o$ (n electrons per unit length). Schematically the situation is shown in FIG. 25, where $\phi(x)$ is the potential at a point x.

The carriers respond to the internal field and occupy a Boltzman distribution $$M = M_o e^{e\phi/kt}$$

If the fields due to the electrons could be neglected, then $$\phi(e) = -Ex$$

This is, of course, too rough an approximation. With n(0) the density of electrons at x=0, and $n_o$, the density of the immobile donor ions $$M(x) = M(0)e^{e\phi(x)/kt}$$

with $\phi(x)$ given by Poisson's equation, $$\frac{d^2\phi}{d\chi^2} = \frac{e}{\epsilon}[M(\chi) - M(o)] = \frac{e}{\epsilon}[M(o)e^{e\phi(\chi)/kT} - M_o]$$

Since for $\phi=0$ $n(0)=n_o$, and since all traps are emptied, assuming electrical neutrality.

$$\int_0^l M_o \int_0^l e^{e\phi/kT} d\chi = M_o l$$

or $$M_o \int_0^l e^{e\phi/kT} d\chi = M_o l$$

then $$\int_0^l \frac{d^2\phi}{d\chi^2} d\chi = \int_0^l \frac{e}{\epsilon}[M(\chi) - M_o] d\chi = 0$$

or $$\frac{d\phi}{d\chi}\bigg|_{\chi=l} = \frac{d\phi}{d\chi}\bigg|_{\chi=0}$$

If the crystal is neutral there must be no electric field at the boundary except the applied field $-E_o$ $$\frac{d\phi}{d\chi}\bigg|_{\chi=o} = E_o$$

$$\frac{d\phi}{d\chi}\bigg|_{\chi=l} = E_o$$

These two boundary conditions allow the solution of Poisson's equation.

Rewriting $$\frac{d^2\phi}{d\chi^2} = \frac{M_o e}{\epsilon}\left[\frac{M(o)}{M_o} e^{e\phi/kT} - 1\right]$$

or $$\frac{d^2\phi}{d\chi^2}\left[\frac{e\phi}{kT}\right] < \frac{M_o e^2}{\epsilon kT}\left[\frac{M(o)}{M_o} e^{e\phi/kT} - 1\right]$$

substituting $$y_o = \ln\frac{M_o}{M(o)} \quad y = \frac{e\phi(\chi)}{kT}, \quad l_D^2 = \frac{\epsilon kT}{M_o e^2}$$

we obtain, $$\frac{d^2y}{d\chi^2} = \frac{1}{l_D^2}[e^{y-y_o} - 1]$$

in this new notation, $$\frac{dy}{d\chi}\bigg|_{\chi=0} = \frac{dy}{d\chi}\bigg|_{\chi=l} = \frac{eE_o}{kT}$$

let

-continued $$\frac{dy}{d\chi} = P$$

$$\frac{d^2y}{d\chi^2} = \frac{dP}{d\chi} = \frac{dy}{d\chi}\frac{dP}{dy} = P\frac{dP}{dy} = \frac{d}{dy}\left(\frac{1}{2}P^2\right)$$

so $$\frac{d}{dy}\left(\frac{1}{2}P^2\right) = \frac{1}{l_D^2} e^{y-y_o} - 1$$

setting $y(0)=0$ since the zero for a potential may be set arbitrarily $$\frac{1}{2}P^2(l) - \frac{1}{2}P^2(o) = \frac{1}{l_D^2}\int_0^l (e^{y-y_o} - 1)dy$$

$$= \frac{1}{l_D^2}[e^{y(l)-y} - y(l) - e^{-y_o}]$$

$$y(\chi) = \frac{e\phi(\chi)}{kT}$$

$$y(l) = \frac{e\Delta y}{kT}$$

$$\frac{dy}{d\chi}\bigg|_o = \frac{dy}{d\chi}\bigg|_l = P(o) = P(l)$$

so $$0 = \frac{1}{l_D^2}[e^{-y_o}(e^\Delta - 1) - \Delta]$$

where $\Delta = \frac{e}{kT}\Delta V$ or $e^{y_o} = \frac{e^\Delta - 1}{\Delta}$, and thus $$\frac{M_o}{M(o)} = \frac{e^\Delta - 1}{\Delta} = \frac{e^{\frac{e}{kT}\Delta V} - 1}{\frac{e}{kT}\Delta V}$$

substituting $$\frac{d}{dy}\left(\frac{1}{2}P^2\right) = \frac{1}{l_D^2}\left[\frac{\Delta}{e^\Delta - 1} e^y - 1\right]$$

so $$\frac{1}{2}P^2(\chi) - \frac{1}{2}P^2(o) = \frac{1}{l_D^2}\left[\frac{\Delta}{e^\Delta - 1}(e^y - 1) - y\right]$$

$$= \frac{1}{l_D^2}\left[\Delta\frac{e^y - 1}{e^\Delta - 1} - y\right]$$

Thus $$\left(\frac{dy}{d\chi}\right)^2 = \left(\frac{eE_o}{kT}\right)^2 + \frac{2}{l_D^2}\left\{\Delta\left(\frac{e^y - 1}{e^\Delta - 1}\right) - y\right\}$$

or $$\frac{dy}{d\chi} = \frac{\sqrt{2}}{l_D}\sqrt{\Gamma^2 + \Delta\left(\frac{e^y - 1}{e^\Delta - 1}\right) - y}$$

where

-continued $$\Gamma^2 = \frac{1}{2} \frac{e}{kT} E_o l_D$$

integrating this equation from 0 to 1 yield $$\int_0^{y(l)} \frac{dy}{\sqrt{\Gamma^2 + \Delta\left(\frac{e^y - 1}{e^\Delta - 1}\right) - y}} = \frac{\sqrt{2}}{l_D} \int_0^l d\chi$$

or, $$\int_0^\Delta \frac{dy}{\sqrt{\Gamma^2 + \Delta\left(\frac{e^y - 1}{e^\Delta - 1}\right) - y}} = \frac{\sqrt{2}\, l}{l_D}$$

which is an implicit expression for $\Delta V$ in terms of $E_o$, $l$, and $l_D$.

For low $n_o$ and/or large $E_o$, $\Gamma$ is large $$\int_0^\Delta \frac{dy}{\sqrt{\Gamma^2}} = \frac{\sqrt{2}\, l}{l_D}$$

$$\Delta = \sqrt{2}\, l\, \Gamma / l_D$$

or $$\Delta \sqrt{2}\, l \times \frac{1}{\sqrt{2}} \left[\frac{e}{kT} E_o l_D\right] l_d$$

$$= \frac{e}{kT} E_o l$$

or $$\Delta V = E_o l$$

which is the original potential across the bulk of the crystal.

The situation of interest is however large $n_o$ and small $l_D$ and small $\Gamma^2$. It is in this situation that $$\Delta = \frac{e}{kT} \Delta V$$

can be expected to vanish.

Expanding the expression for $\Delta$ small, which is always the case, then $$\Delta \frac{e^y - 1}{e^\Delta - 1} - y \simeq \frac{1}{2} y^2 - \frac{1}{2} y\Delta.$$

Keeping only second order terms in $y$ and $\Delta$, then $$\int_0^\Delta \frac{dy}{\Gamma^2 + \frac{1}{2}(y^2 - y\Delta)} = \frac{l\sqrt{2}}{l_D}.$$

Let $\xi = y - \frac{\Delta}{2}$, this becomes $$\int_{-\Delta/2}^{\Delta/2} \frac{d\xi}{\sqrt{\left(\Gamma^2 - \frac{1}{8}\Delta^2\right) + \frac{1}{2}\xi^2}} = \frac{l\sqrt{2}}{l_D}.$$

Setting $$\xi = \sqrt{2\Gamma^2 - \left(\frac{\Delta}{2}\right)^2} \cdot \sinh\sigma$$

gives $$2\sqrt{2}\, \sinh^{-1}\left[\frac{\Delta/2}{\sqrt{2\Gamma^2 - \left(\frac{\Delta}{2}\right)^2}}\right] = \frac{\sqrt{2}\, l}{l_D}$$

or $$\Delta\, 2\sqrt{2}\, \Gamma \tanh \frac{l}{2l_D}$$

or $$\Delta V = E_o(2l_D)\tanh \frac{l}{2l_D},$$

clearly as $$l_D \to 0 \quad \Delta V \to 0.$$

This approximation for $\Delta V$ is good for all reasonable values of T.

Illumination thus reduces the dark bulk emf=$E_o l$, producing a net photovoltage $$V_{PHOTO} = E_o l \left[1 - \frac{\tanh \frac{l}{2l_D}}{\frac{l}{2l_D}}\right]$$

where $$l_D = \sqrt{\frac{EkT}{M_o e^2}}$$

A simplified expression occurs for small $l/(2l_D)$, where $\tan h_x \simeq x - \frac{1}{3}x^3$ $$V_{PHOTO} = E_o l \left[\frac{1}{2}\left(\frac{l}{2l_D}\right)^2\right]$$

Here, it is clear that the photovoltage becomes insignificant for $(l/l_D)$ small.

The implication is therefore that photovoltaic contributions from the bulk will be much larger than that from the surface layers, for surface layers are extremely small while $l_D$ can be estimated as very roughly equal in the bulk and the surface.

Thus, illumination will result in the varnishing of the internal field within the bulk resulting in a max photo-emf.

$\Delta V = E_2 l$ where $E_2$ is the bulk field.

For small intensities, we can assume $n_o$ small, then $$V_{PHOTO} = E_o l^3 \frac{1}{4} \frac{n_o e^2}{ekT}$$

i.e., the photovoltage is proportional to $n_o$ which can be reasonably assumed proportional to intensity which is experimentally observed (see FIG. 4).

The model just described explains the long wave length photo-emfs, in the material Pb(Zr$_{0.53}$, Ti$_{0.47}$)O$_3$+1 wt% Nb$_2$O$_5$. Such a deep trapping level is probably typical of the lead titanate-lead zirconate materials with characteristic lead vacancies. These bind electrons leaving holes (producing p type dark conductivity). The addition of common dopants—for example niobium gives rise to free electrons which combine with holes or get trapped by the lead vacancies. The doping can thus be said to provide electrons which fill traps.

It is these trapped electrons which are photo-injected into the conduction band by the long wave length light providing near maximum photo-emfs in material illuminated at 500 nm and even longer wave lengths as shown in the results plotted in FIG. 13. Full saturation, that is the complete shielding of the bulk internal field, requires however band gap carriers which occurs as one approaches the 373 nm band gap wave length. Solving this problem, that of band gap carriers in addition to electrons generated by deep traps, can be accomplished in a manner similar to that which was accomplished for the trapped electrons but is more complex for example because mobile holes are being produced in addition to electrons and one cannot necessarily fix the maximum number of carriers.

The photo-emfs are created by photo-induced carriers shielding the bulk field. Effectively, no photocurrent can flow however unless band gap light is present as is clear from the results shown in FIGS. 12 and 13. Here it is clear that the band gap light produces maximum photo-emf and maximum photocurrents, less than band gap light, max or almost maximum photo-emf but no photocurrents and that the output resistance under these circumstances appears extremely high. Addition of band gap light allows current to flow.

The tentative explanation is that the surface layers form high resistance barriers, the magnitude of which lowers with band gap light. The surface layers thus act as intrinsic photoconductors in series with an emf. This picture not only explains the rather unique dependence of photo-emf and short circuit photo-current on wave length as shown in FIGS. 12 and 13 but also the equivalent circuit which is typical of all these materials as described in FIG. 2 and as indicated by the current-voltage results in FIG. 3.

A possible explanation for the high resistance of the surface layers is that they include quantities of charged ions which have been localized there. These are immobile under normal applied voltages moving only under the action of high fields such as produced by the reversal of the remanent polarization. Those ions not only will occupy trapping levels, eliminating the need for easily ionized trapped electrons and thus reducing the intrinsic conductivity but also form centers for coulomb scattering of conduction electrons which should contribute markedly to the resistivity.

Efficiency

Some insight into the possible maximum efficiency of the process can be obtained by considering carriers generated by band gap light with potential energy $$V = 2 \int_0^L e\phi(\chi)\delta M_o d\chi$$

with $\phi(x) < Ex$ so that a maximum value of energy $$V = 2e \int_0^L E\delta M \chi d\chi$$

$$= e\delta M_o E L^2$$

The energy required to produce $\delta m_o$ electron hole pairs $$\epsilon = \delta M_o L E g,$$

where Eg is the band gap energy.
The power into the crystal is $$P_m = LEg \frac{\delta M_o}{\delta t}$$

while the power out (time rate of increase in internal potential energy) is $$P_{out} = eEL^2 \frac{\delta M_o}{\delta T}$$

The efficiency $= \frac{eEL}{Eg}$.

For Pb(Zr$_{0.53}$, Ti$_{0.47}$)O$_3$+1 wt% Nb$_2$O$_5$ added E is roughly 600 v/cm and the grain size roughly 5 microns. The emf across a grain is thus about 0.3 volts. The band gap is about 3 eV. Thus the efficiency is $$\simeq 0.3/3 \simeq 10\%,$$

which compares with an observed band gap efficiency of about 0.06%. The calculation, of course, depends on idealizing assumptions, some of which may be practically obtainable.

Radioactively Ionized Battery

The teaching herin may be applied toward the provision of a novel high voltage battery of the present invention which serves to convert radiation such as X-radiation in this instance, directly into electrical energy. In this respect, a block or substrate of ferroelectric ceramic material would again be provided to which electrodes are attached in the identical fashion as was discussed with respect to the basic physical configuration disclosed above and illustrated in FIG. 1 of the application drawings. An example of the constituent material of the ferroelectric ceramic in this instance is solid solution PZT-5A consisting of 53 mole percent ZrTiO$_3$ and 47 mole percent PbTiO$_3$ with 1 percent by weight niobium added, such as Nb$_2$O$_5$. This ferroelectric ceramic material would be poled in the usual fashion by the application of a high voltage applied across the electrodes.

To function as a battery, the ceramic material can contain a radioactive component and this can be all or a portion of any of the above-discussed constituent elements. For example, the material may be fabricated with a radioactive isotope of Zr,TiO,Nb, etc., or a radioactive additive can be added to the composition. Alternatively, the composition may be placed next to a strong radioactive source and, for example, could actually be coated with a radioactive material. The primary requirement herein is that a flux of gamma rays or X-rays within the material be produced, which radiation has the effect of ionizing the ferroelectric ceramic material so as to produce non-equilibrium carriers.

Thus, in the instance of the application of a poled ferro-electric ceramic material as a high voltage battery, an external light source would not be required as the ionizing source in that the non-equilibrium carriers would be produced by the internal ionization of the ferroelectric ceramic material effected by the radiation and would result in an emf which would appear across the electrodes.

Accordingly, an open circuit voltage proportional to the length of the ferroelectric ceramic material between the electrodes and inversely proportional to average grain size, and the like as was discussed at the outset of this specification would be produced by the gamma or X-radiation. Similarly, a short circuit current proportional to the electrode area and the net (steady state) increment of excess carriers introduced into the conduction band would likewise be produced, this being related to the intensity of the ionizing radiation.

As can be appreciated, the emf would persist as long as the ionizing radiation persisted and, extrapolating from the detailed photo-effect results, the emf produced by this high voltage battery would be relatively independent of the intensity of the radiation and thus not strongly dependent on the half-life of the radioactive material.

While there has been shown and described several preferred embodiments and applications of the basic invention hereof, those skilled in the art should appreciate that such embodiments are exemplary and not limiting and are to be construed within the scope of the following claims: ACCORDINGLY

What is claimed is:

1. An electrical battery apparatus comprising,
a substrate of a radioactively ionized polycrystalline ferroelectric ceramic material disposed between two conductive electrodes, and
electrical means for remanently polarizing said substrate in a predetermined direction.

2. A battery comprising,
a substrate of an electrically polarized polycrystalline ferroelectric ceramic material which is integrally combined with a radioactive material, and,
a pair of conductive electrodes, said substrate being disposed between said electrodes.